(12) United States Patent
Falslev et al.

(10) Patent No.: US 10,588,248 B1
(45) Date of Patent: Mar. 10, 2020

(54) RADIAL EMI AND ENVIRONMENTAL GASKET

(71) Applicant: L-3 Communications Corp., New York, NY (US)

(72) Inventors: Joshua M. Falslev, Uintah, UT (US); Jed R. Hill, Taylorsville, UT (US); Devon K. Newman, Salt Lake City, UT (US)

( * ) Notice: Subject to any disclaimer, the term of this patent is extended or adjusted under 35 U.S.C. 154(b) by 318 days.

(21) Appl. No.: 15/719,898

(22) Filed: Sep. 29, 2017

Related U.S. Application Data (62) Division of application No. 14/522,859, filed on Oct. 24, 2014, now abandoned.

(51) Int. Cl.
    *F16J 15/02*      (2006.01)
    *H05K 9/00*      (2006.01)
    *H05K 5/00*      (2006.01)

(52) U.S. Cl.
    CPC .......... *H05K 9/0081* (2013.01); *F16J 15/022* (2013.01); *H05K 5/0086* (2013.01)

(58) Field of Classification Search
    CPC .. F16J 15/02; F16J 15/062; F16J 15/00; F16J 15/021; F16J 15/025; B65D 43/00; B65D 43/02
See application file for complete search history.

(56) References Cited

U.S. PATENT DOCUMENTS

| | | | | |
|---|---|---|---|---|
| 4,241,864 A | * | 12/1980 | Kessler | ................... B65D 15/08 215/233 |
| 5,050,764 A | | 9/1991 | Voss | |
| 5,238,136 A | | 8/1993 | Kasugai | |
| 5,566,055 A | * | 10/1996 | Salvi, Jr. | .............. H05K 9/0037 361/816 |
| 6,161,841 A | | 12/2000 | Shaw | |
| 7,034,238 B2 | * | 4/2006 | Uleski | ................ G07C 9/00944 200/341 |
| 7,441,525 B2 | | 10/2008 | Jessberger | |
| 7,663,878 B2 | * | 2/2010 | Swan | ................... G06F 1/1632 361/679.3 |

(Continued)

FOREIGN PATENT DOCUMENTS

WO      2013110112      8/2013

OTHER PUBLICATIONS

Non-Final Office Action for U.S. Appl. No. 14/522,859 dated Mar. 3, 2017.

*Primary Examiner* — Vishal A Patel
(74) *Attorney, Agent, or Firm* — Workman Nydegger (57) ABSTRACT

A radial electromagnetic interference and environmental gasket for use in a handheld communication device is provided. The radial gasket is adapted to provide a seal against electromagnetic interference and environmental conditions, as well as radio-frequency isolation between the transmit (Tx) and receive (Rx) channels of a handheld communication device in which the gasket is used, and includes first and second side members and first and second end members, each of which has an inner surface, outer surface and upper and lower face portions, operatively connected and cooperating with one another to form a body member; a plurality of ribs operatively connected to each of the outer surfaces and extending laterally outwardly therefrom; and a recess formed in and defined by each of the upper face portions.

25 Claims, 7 Drawing Sheets

(56) References Cited

U.S. PATENT DOCUMENTS

| | | | |
|---|---|---|---|
| RE43,519 E | 7/2012 | Gnecco | |
| 8,796,548 B2* | 8/2014 | Rost | H05K 5/061 |
| | | | 174/50 |
| 9,521,772 B2 | 12/2016 | Etlinger | |
| 2013/0307227 A1 | 11/2013 | Ueda | |

* cited by examiner

RADIAL EMI AND ENVIRONMENTAL GASKET

CROSS-REFERENCE TO RELATED APPLICATIONS

This application is a divisional of U.S. patent application Ser. No. 14/522,859 filed Oct. 24, 2014, which claims priority of U.S. Patent Application No. 61/987,892, filed May 2, 2014. The entire content of each of aforementioned patent applications is incorporated herein by reference.

BACKGROUND

1. Field of the Invention

The present invention relates generally to a radial electromagnetic interference (EMI) and environmental gasket. More specifically, the present invention relates to a radial EMI and environmental gasket for a handheld communication device adapted for use in harsh operating environments.

2. Background of Invention

Radial gaskets for use in various applications provide proper sealing to protect various internal operating components and operating functions of the device in which the gasket is incorporated from damage resulting from exposure to external environmental conditions.

For example, U.S. Pat. No. 4,357,026 issued Nov. 2, 1982, to Panchetti for a "Radial Gasket with Protruding Lip Portion" discloses a radial gasket for use in connection with shafts that are axially movable within a cylinder containing a pressurized fluid. The radial gasket includes a rigid support ring and shaped body member having a lip on the surface of the shaft. These novel features of Panchetti's gasket structure increase its scraping effect and minimize the possibility of fluid blowout.

The stresses arising from internal fluid pressures are avoided without negatively affecting the positioning of the gasket lip with respect to the relevant articulation line of the gasket.

In another example, U.S. Pat. No. 5,484,466 issued Jan. 16, 1996, to Brown et al. for an "Air Filter Element with Radial Seal Sealing Gasket" discloses an DEN-475 12-1 air filter element that includes a media pack formed by inner and outer tubular liners and by a sleeve of filer media located between the liners. Brown et al. further discloses that when the filter element is installed in a housing, the sealing gasket resiliently engages a sleeve and establishes a radial seal between the filter element and the sleeve.

The sealing gaskets disclosed in the representative prior art disclosures noted above address the issue of sealing a device against contamination from external environmental conditions. However, they do not address the issue of sealing against electromagnetic interference as well as against external environmental conditions, both of which are necessary in certain technological applications, principally in telecommunication devices deployed in military, law enforcement and firefighting applications where such devices may be exposed to harsh external operating environments and where electromagnetic interference may possibly disrupt critical communications capabilities. Moreover, from a production, assembly and installation standpoint, prior art gaskets, such as extruded gaskets, Form In Place Gaskets (FIPG), and O-rings, require relatively sturdy gasket sealing recesses having large wall thickness and multiple securing screws to ensure proper sealing, sealing engagement and retention of the gasket, particularly under elevated pressures. This increases the size, weight, material requirements and costs of a device in which a seal is required and reduces the internal space capacity in a device housing or body member for any internally-positioned operating components and/or electronic circuitry. In addition, installing conventionally formed gaskets can also be time consuming, inconsistent and can often lead to failure as a result of being under or oversized.

Accordingly, a need has arisen for a radial gasket design that provides sealing against both electromagnetic interference and environmental conditions while, at the same time, providing reduced material weight and size requirements for and easy installation into any device in which a gasket may be employed. The present invention addresses this need in the art as well as other needs, which will become apparent to those skilled in the art from this disclosure.

BRIEF DESCRIPTION OF THE DRAWINGS

FIGS. 5(a) and (b) are cross-sectional views of portions of the another radial gasket of the present invention in accordance with an embodiment, showing elements thereof in greater detail;

FIGS. 6(a) and (b) are cross-sectional views of portions of the radial gasket of the present invention in accordance with another embodiment, showing elements thereof in greater detail;

DETAILED DESCRIPTION

It should be noted that the present description is by way of illustration only, and that the concepts and examples presented herein are not limited to use or application with any single radial EMI and environmental gasket. Hence, while the details of the gasket described herein are for the convenience of illustration and explanation with respect to the exemplary embodiments, the principles disclosed may be applied to other types of radial EMI and environmental gaskets without departing from the scope of the present invention.

Figure 1:
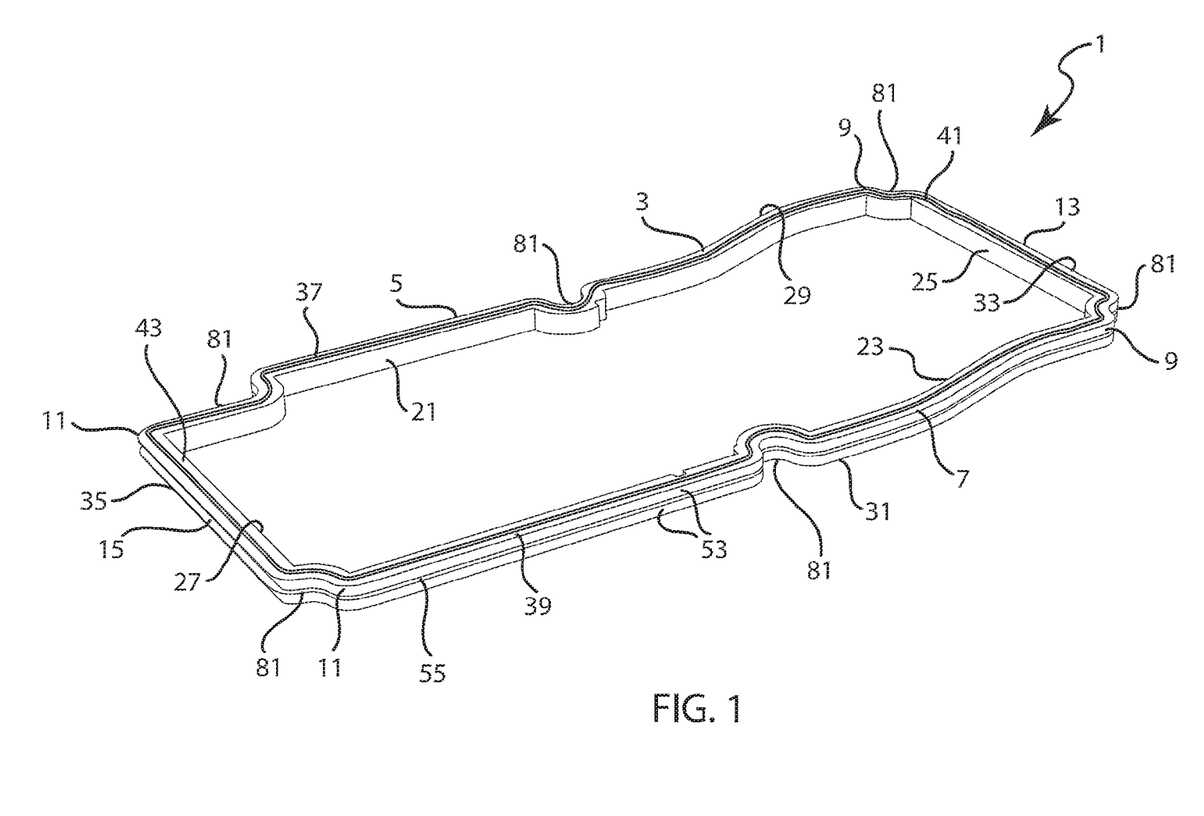
FIG. 1 is a side perspective view of a radial gasket of the present invention in accordance with an embodiment.
Figure 2:
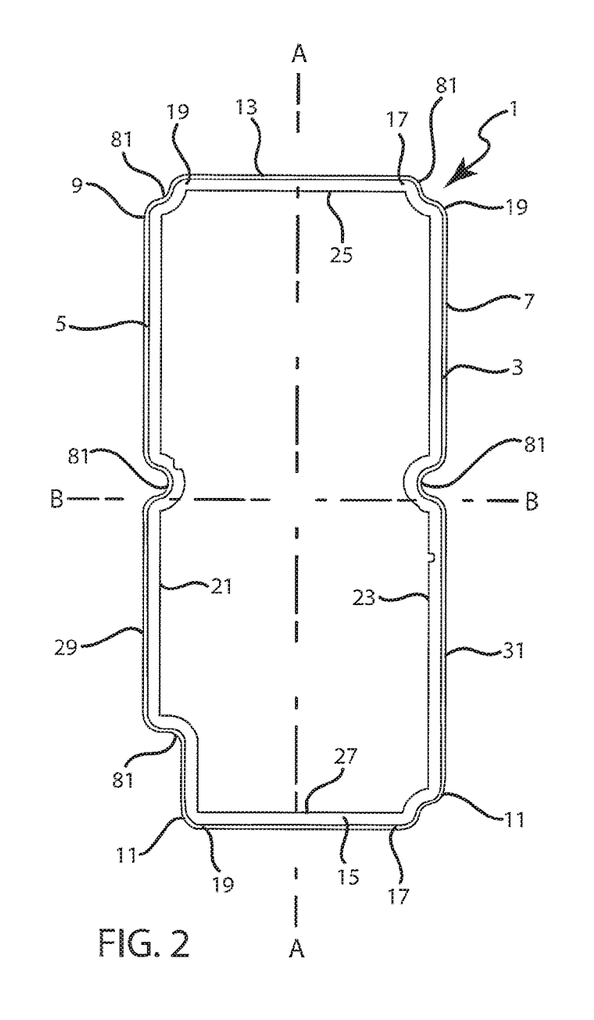
FIG. 2 is a top plan view of the radial gasket of the present invention in accordance with an embodiment.
Figure 3:
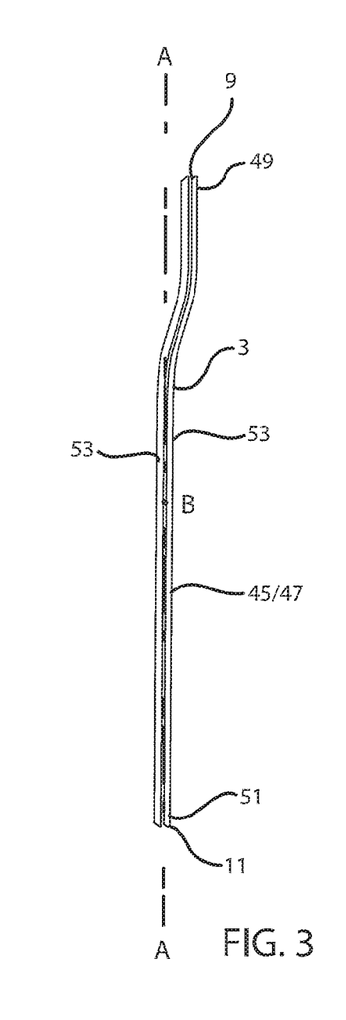
FIG. 3 is a side elevation view of the gasket of FIGS. 1 and 2.

Referring to FIGS. 1-3, a radial electromagnetic interference (EMI) and environmental gasket in accordance with an embodiment of the present invention is shown generally by the numeral 1. By way of example and not of limitation, and as explained further below, the radial gasket may be used for electromagnetic interference and environmental protection sealing of a handheld communication device. However, a gasket in accordance with the present invention may be used in other applications and environments as well without limiting the scope of the instant invention.

The radial gasket 1 comprises a generally rectangular shaped, planar body member 3 lying in a plane defined by a longitudinal axis A-A and a transverse axis B-B. The body member 3 includes a first side member 5 and a second side member 7, each extending substantially parallel to the longitudinal axis A-A of the plane and each having a distal end 9 and a proximal end 11. The body member further includes a first end member 13 and second end member 15 extending substantially parallel to the transverse axis B-B of the plane, each end member having a distal end 17 and a proximal end 19. The first end member is operatively connected at its distal and proximal ends to the distal ends of the first and second side members respectively. Similarly, the second end member is operatively connected at its distal and proximal ends to the proximal ends of the first and second side members respectively. The first and second side members and the first and second end members each have an inner surface 21,23,25, 27 respectively, an outer surface 29, 31, 33, 35 respectively, an upper face portion 37, 39, 41,43 respectively, and a lower face portion 45, 47, 49,51 respectively, disposed intermediate to the inner and outer surfaces and cooperating therewith to define the body member.

The radial gasket 1 further comprises a plurality of ribs 53 operatively connected to each of the outer surfaces and extending laterally outwardly therefrom, thereby providing a seal against electromagnetic interference and environmental conditions when the gasket is installed in a handheld communication device, as will be discussed in greater detail below. The radial gasket further comprises a recess 55 (see FIGS. 5 and 6) formed in and defined by each of the upper face portions.

In an embodiment of the present invention, the radial gasket may be a unitary molded body member. In another embodiment of the present invention, however, the side members 5, 7 and end members 13, 15 of the body member 3 may be individually molded and include means for operatively connecting the members to one another in order to form a continuous seal. The means for operatively connected the members to one another may comprise heat bonding, adhesive bonding or applying pressure to the end members at their respective ends. The radial gasket may be formed of a conductive elastomer material selected from the group consisting of silicone, RTV, fluorosilicone, polyurethane, rubber, silicone with conductive filler, fluorosilicone with conductive filler and thermoplastic and thermosetting polymers. In yet another embodiment of the present invention, the conductive elastomer material is silicone and, more specifically, may be CHO-SEAL® 1215.

Figure 4:
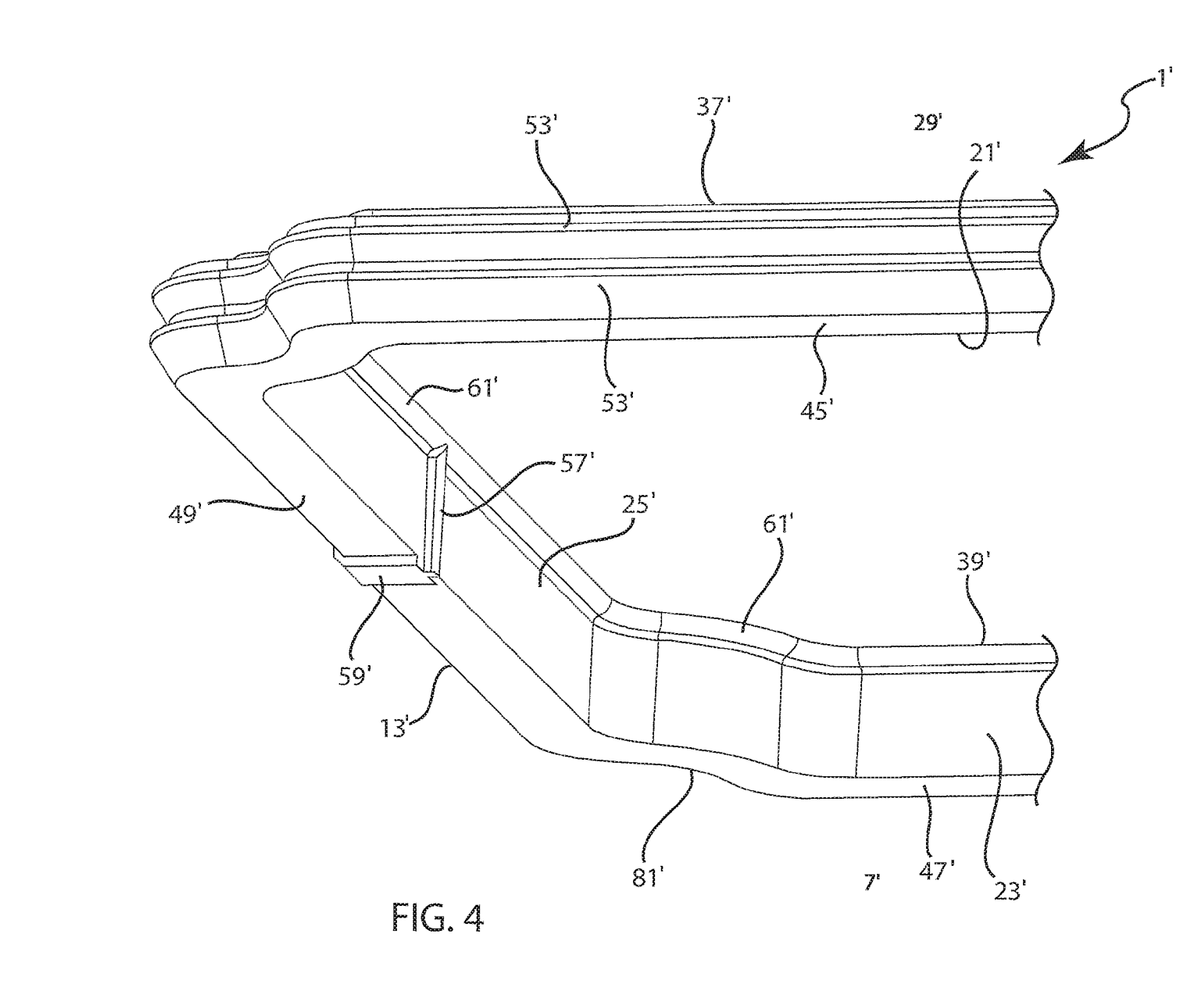
FIG. 4 is a side perspective view of a portion of another radial gasket of the present invention in accordance with an embodiment.

Referring now to FIG. 4, a portion of a radial EMI and environmental gasket in accordance with an embodiment of the present invention is shown in greater detail. The radial gasket is similar in construction to the radial gasket shown in FIG. 1 but may further include a first rib 57' extending substantially vertically and radially inwardly along the inner surface 25' of the first end member 13', and a second rib 59' extending substantially horizontally and radially downwardly and outwardly along the lower face portion 49' of the first end member 13'. The first and second ribs are structured and arranged so as to provide radio-frequency isolation between the transmit (Tx) and receive (Rx) channels and electronic components (not shown) of a handheld communication device in which the gasket is used.

Figures 5A, 5B:
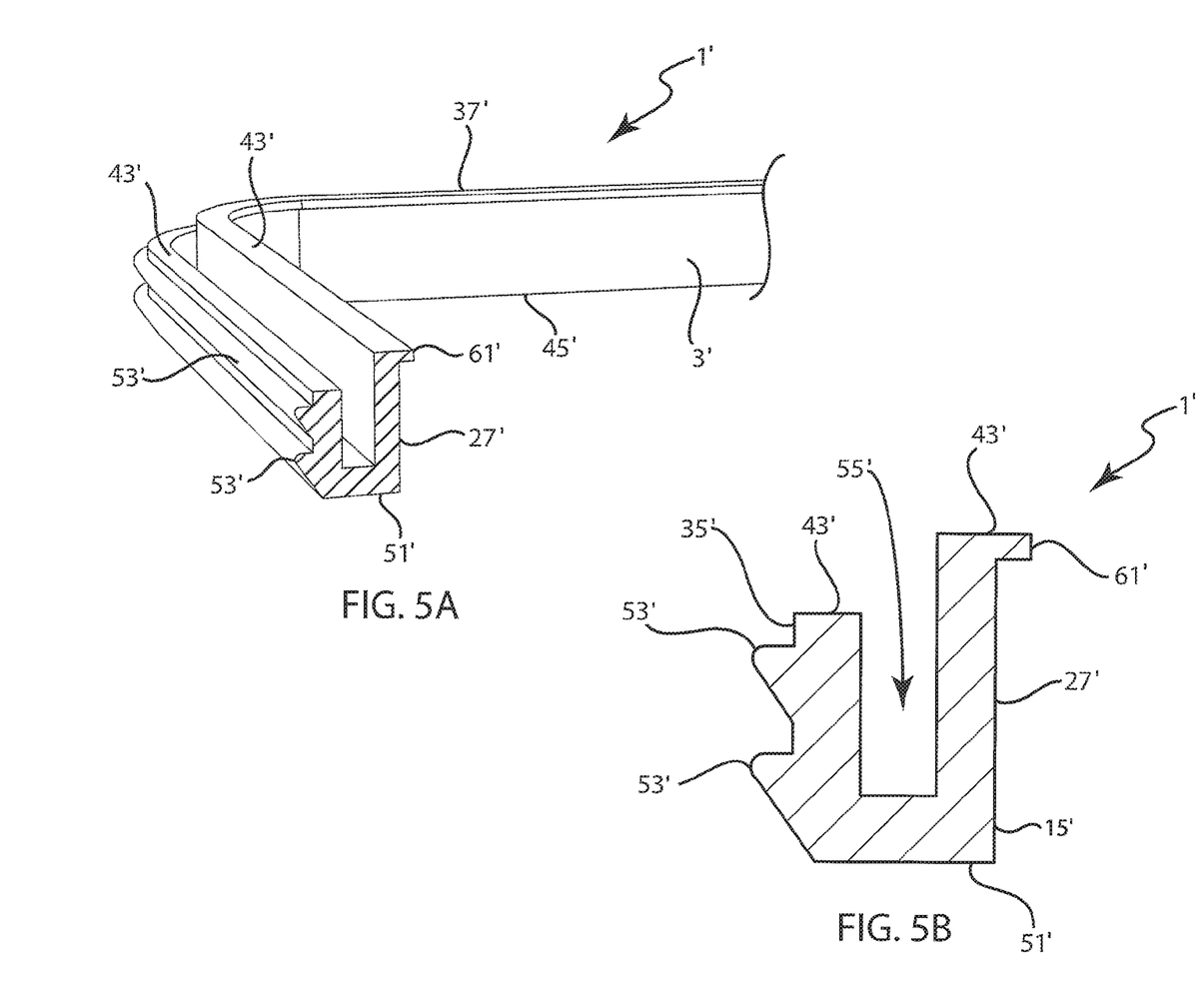
Figures 6A, 6B:
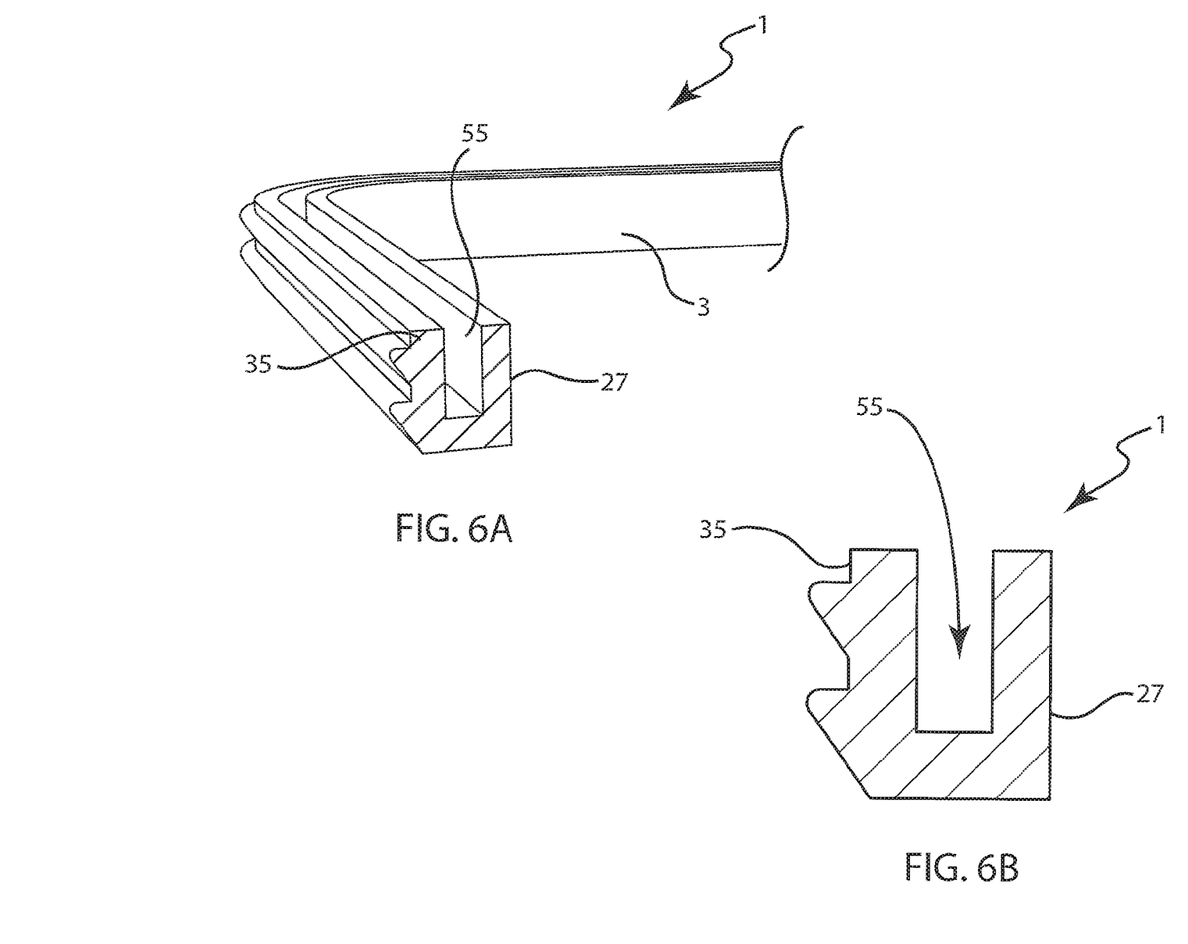
Figure 8:
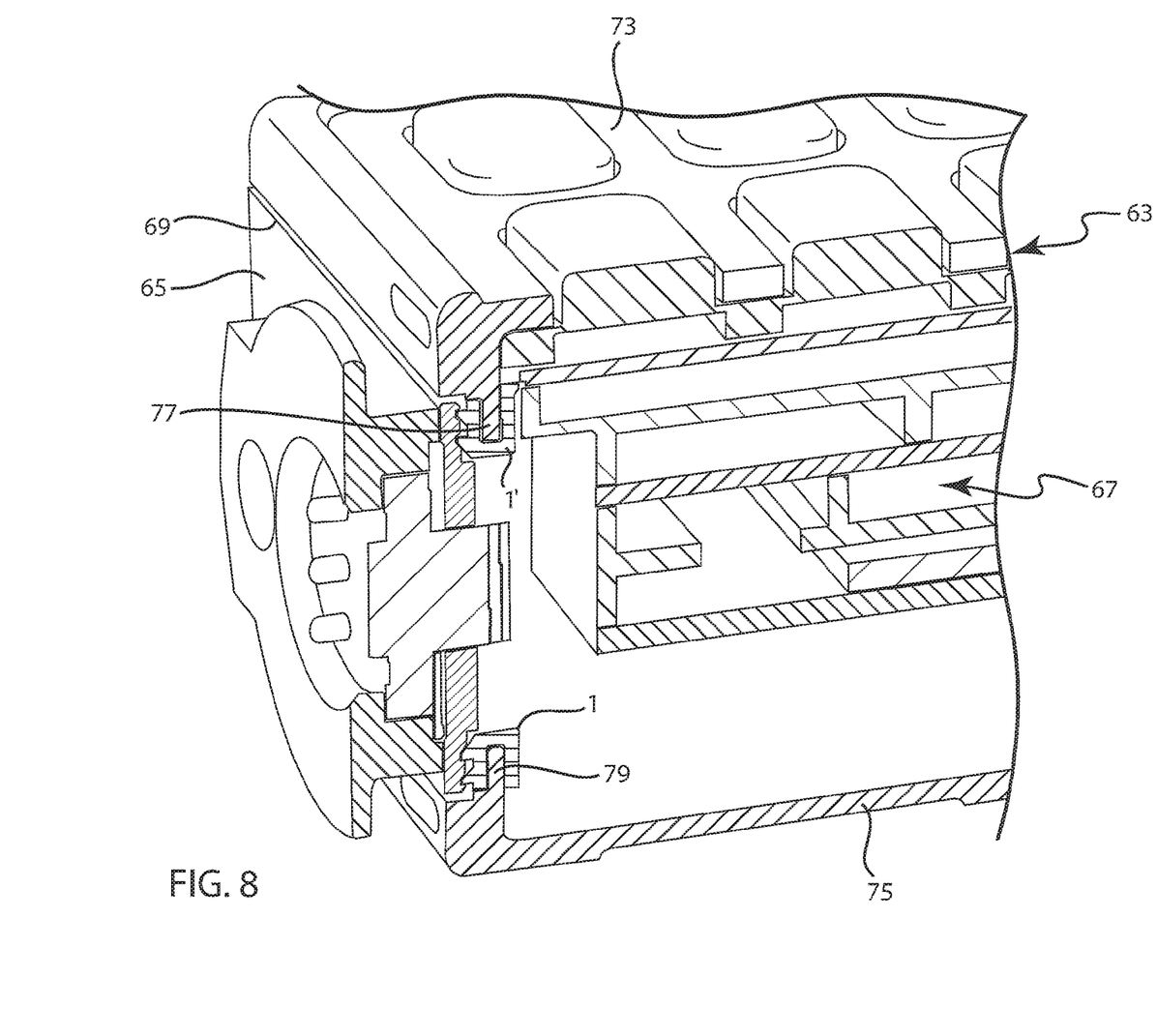
FIG. 8 is a cross-sectional perspective view of a portion of a handheld communication device of FIG. 7 in accordance with an embodiment.

Referring now to FIGS. 4, 5 and 8, a cross-section of a radial EMI and environmental gasket adapted for installation on the top or keypad side of a handheld communication device in accordance with another embodiment of the present invention is shown. The radial gasket 1' is similar in construction to the radial gasket 1 shown in FIG. 1. In this embodiment, however, the inner surface portions represented by 21',23', 25' and 27' of radial gasket 1, of each of the side and end members 5', 7', 13' and 15' are slightly longer than the corresponding outer surface portions 29', 31', 33, and 35' thereof and include an inwardly extending protrusion 61'. The protrusion 61' provides further radio-frequency isolation between the transmit (Tx) and receive (Rx) channels and electronic components of the handheld communication device in which the gasket is used. In contrast, as shown in FIGS. 6 and 8, the inner surface portions 21, 23, 25, and 27 of each of the side and end members 5, 7, 13, and 15 of a gasket 1 having a body portion 3 adapted to fit between the housing and a bottom cover of the handheld communication device may be the same length as the outer surface portions 29, 31, 33, and 35 thereof, inasmuch as the keypad is on the other side of the device and the transmit/receive isolation function is not required on the bottom portion.

Figure 7:
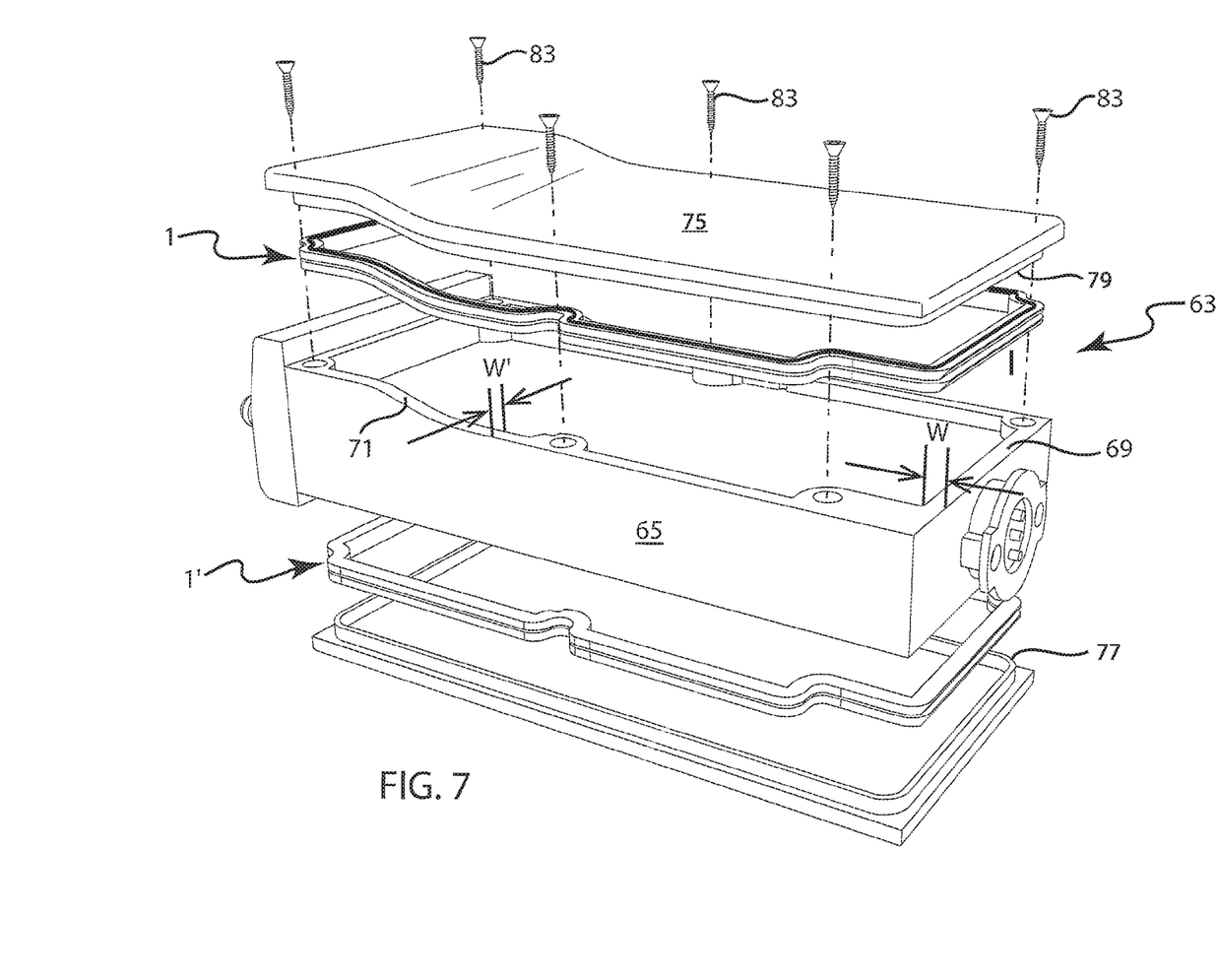
FIG. 7 is an exploded side perspective view of a handheld communication device incorporating the radial gasket of the present invention in accordance with an embodiment.

Referring now to FIGS. 7 and 8, a handheld communication device incorporating a pair of radial gaskets 1 and 1' in accordance with embodiments of the present invention is generally shown at 63. The radial gaskets are similar in construction to the radial gaskets shown in FIGS. 1 and 6 and described above.

The handheld communication device 63 includes a housing member 65 structured and arranged to contain the electronic components illustrated generally at 67 in FIG. 8 of the device. The housing member includes a first and second wall member 69, 71 respectively defining a respective seal for the gaskets, each of the first and second wall members having a preselected width w/w' respectively. The unique and novel design of the gasket of the present invention permits the preselected width of the wall members to be less than the corresponding elements of prior art devices, hence realizing a reduction in material requirements for the housing and a corresponding reduction in the overall weight of the device. By way of example, in an embodiment, the wall member widths may be less than approximately 1.120, and may be as thin as 0.045 inches. Not only does the use of thin walls reduce the weight of the handheld communication device, but also provides more internal space for the various circuit card assemblies.

The housing member further includes a top and bottom cover 73, 75; each cover structured and arranged to seal the electronic components of the handheld communication device from environmental elements and external electromagnetic interference. Each of the top and bottom covers includes a gasket mounting member 77, 79 respectively, extending substantially outwardly from and circumferentially around the periphery of each of the top and bottom covers. In one embodiment of the present invention, the gasket mounting members 77, 79 are structured to be received by the recesses 55' and 55 formed in and defined by each of the body portions 3' and 3 of the radial gaskets 1' and 1 respectively.

The gaskets 1/1' of the present invention further include a plurality of inset portions 81/81' adapted to receive attachment means for securing the top and bottom covers to the housing. In an embodiment of the present invention, the attachment means for securing the top and bottom covers 73, 75 respectively, of the housing 65 are in the form of threaded fasteners or screws 83; however, it is to be understood that other means of attachment may also be used without departing from the scope hereof. The threaded fasteners allow each of the top and bottom covers 73, 75 to be adjustably fitted to the housing member whereby the spacing there between may be allowed to vary or "float" while each of the gaskets are still secured in sealing engagement between the respective covers and the housing. This unique structure allows for variations in the size, thickness and quantity of the electronic design components and circuit card assemblies contained within the housing, depending upon the operating characteristics and requirements of the communication device.

Changes may be made in the above devices and structures without departing from the scope hereof. It should thus be noted that the matter contained in the above description and/or shown in the accompanying drawings should be interpreted as illustrative and not in a limiting sense. The following claims are intended to cover all generic and specific features described herein, as well as all statements of the scope of the present device and structure, which, as a matter of language, might be said to fall therebetween.

We claim:

1. A system for using a radial gasket to provide electromagnetic interference and environmental sealing of a handheld communication device, the system comprising:
    a first radial gasket including:
        a first elongate body member forming an opening, the first elongated body member having first inner surfaces, first outer surfaces, and first upper and lower face portions disposed intermediate to the first inner and outer surfaces and cooperating therewith to form the first elongate body member;
        a first plurality of ribs operatively connected to each of the first outer surfaces of the first radial gasket and extending laterally outwardly therefrom, each of the first plurality of ribs having a substantially triangular cross-section; and
        a first recess formed in and defined by each of the first upper face portions of the first radial gasket; and
    a second radial gasket including:
        a second elongate body member forming an opening, the second elongated body member having second inner surfaces, second outer surfaces, and second upper and lower face portions disposed intermediate to the second inner and outer surfaces and cooperating therewith to form the second elongate body member;
        a second plurality of ribs operatively connected to each of the second outer surfaces of the second radial gasket and extending laterally outwardly therefrom, each of the second plurality of ribs having a substantially triangular cross-section; and
        a second recess formed in and defined by each of the second upper face portions of the second radial gasket; and
    a housing member structured and arranged to contain electronic components, the housing member comprising a first and second wall member defining a seal for the first and second radial gaskets, each of the first and second wall members having a preselected width; and
    a top and bottom cover structured and arranged to seal the electronic components of the handheld communication device inside the housing member, the top cover including a first gasket mounting member and the bottom cover including a second gasket mounting member extending substantially outwardly from and circumferentially around the periphery of the top and bottom covers, the first and second gasket mounting members structured to be received by the recess in each of the upper face portions of the first and second radial gaskets, respectively;
    wherein the first and second radial gaskets are structured and arranged to provide environmental sealing and shielding from external electromagnetic interference in combination with the housing member and the top and bottom covers when receiving the first and second gasket mounting members of the top and bottom covers and installed in the seal defined in the housing member;
    the top and bottom covers and the housing member are structured and arranged to be adjustably fitted and secured to one another; and
    the plurality of ribs on the outer surfaces of the first and second radial gaskets allow for variation or float to exist between the top and bottom covers and the housing member while the first and second radial gaskets are still secured to provide sealing engagement; and
    wherein the first elongated body member comprises a first end member that includes a first rib extending substantially vertically and radially along the inner surface thereof; and
    where the first end member further includes a second rib coupled to the first rib and extending substantially horizontally and radially along the first lower face portion thereof.

2. The system of claim 1, the first elongated member comprising at least two side members, wherein the inner surface portion of each of the side members is the same length as the outer surface portion thereof.

3. The system of claim 1, wherein the first elongated member comprises at least two side members, the inner surface portion of each of the side members is slightly longer than the outer surface portion thereof and includes an inwardly extending protrusion.

4. The system of claim 1, wherein the first elongated member comprising at least two side members and at least two end members which are individually molded and include means for operatively connecting the members to one another to form a continuous seal.

5. The system of claim 4, wherein the means for operatively connecting the members to one another comprises heat bonding.

6. The system of claim 4, wherein the means for operatively connecting the members to one another comprises adhesive bonding.

7. The system of claim 4, wherein the means for operatively connecting the members comprises applying pressure to the members at their respective ends.

8. The system of claim 1, wherein the first and second radial gaskets are unitary molded body members.

9. The system of claim 1, wherein the radial gasket is formed of a conductive elastomer material selected from the group consisting of silicone, RTV, fluorosilicone, polyurethane, rubber, silicone with conductive filler, fluorosilicone with conductive filler and thermoplastic and thermosetting polymers.

10. The system of claim 9, wherein the conductive elastomer material is silicone.

11. The system of claim 10, wherein the silicone is silver-plated copper filled silicone.

12. A system for using a radial gasket to provide electromagnetic interference and environmental sealing of a handheld communication device, the system including:
    a housing member structured and arranged to contain the electronic components of the handheld communication device, the housing member including a first and second wall member, each of the first and second wall members having a preselected width;

a top and bottom cover structured and arranged to seal the electronic components of the handheld communication device from environmental elements and external electromagnetic interference, each of the top and bottom covers including:

first and second gasket mounting members extending substantially outwardly from and circumferentially around the periphery of each of the top and bottom covers respectively; and a plurality of inset portions configured to receive means adapted to receive attachment means for securing the top and bottom covers to the housing, each of the top and bottom covers adapted to receive first and second radial gaskets respectively; and the first and second radial gaskets each comprising:

an elongate body member having longitudinal and transverse axes defining a plane, the elongate body member including:

first and second side members extending substantially parallel to the longitudinal axis of the plane, each side member having a distal and proximal end;

first and second end members extending substantially parallel to the transverse axis of the plane, each end member having a distal and proximal end;

the first end member being operatively connected at the distal and proximal ends thereof to the distal ends of the first and second side members respectively;

the second end member being operatively connected at the distal and proximal ends thereof to the proximal ends of the first and second side members respectively;

each of the side and end members having an inner surface, an outer surface, and upper and lower face portions disposed intermediate to the inner and outer surfaces and cooperating therewith to form the body member;

a plurality of ribs operatively connected to each of the outer surfaces and extending laterally outwardly therefrom; and a recess formed in and defined by each of the upper face portions; and wherein the radial gasket allows the preselected width to be less than 0.120 inches; and wherein the first end member of the first radial gasket includes a first rib extending substantially vertically and radially along the inner surface thereof; and wherein the first end member of the first radial gasket further includes a second rib, coupled to the first rib, extending substantially horizontally and radially along the lower face portion thereof; and wherein each of the gasket mounting members formed on the top and bottom covers are structured to be received by the recess.

13. The system of claim 12, wherein the first and second ribs are structured and arranged to provide isolation between the transmit (Tx) and receive (Rx) frequencies of the handheld communication device.

14. The system of claim 12, wherein the inner surface portion of each of the side members is the same length as the outer surface portion thereof.

15. The system of claim 12, wherein the inner surface portion of each of the side members is slightly longer than the outer surface portion thereof and includes an inwardly extending protrusion.

16. The system of claim 12, wherein the attachment means are threaded fasteners.

17. The system of claim 12, wherein the preselected width of each of the wall members is 0.045 inches.

18. The system of claim 12, wherein the side members and end members are individually molded and include means for operatively connecting the members to one another to form a continuous seal.

19. The system of claim 18, wherein the means for operatively connecting the members to one another comprises heat bonding.

20. The system of claim 18, wherein the means for operatively connecting the members to one another comprises adhesive bonding.

21. The system of claim 18, wherein the means for operatively connecting the members comprises applying pressure to the members at their respective ends.

22. The system of claim 12, wherein the radial gasket is a unitary molded body member.

23. The system of claim 12, wherein the radial gasket is formed of a conductive elastomer material selected from the group consisting of silicone, RTV, fluorosilicone, polyurethane, rubber, silicone with conductive filler, fluorosilicone with conductive filler and thermoplastic and thermosetting polymers.

24. The system of claim 23, wherein the conductive elastomer material is silicone.

25. The system of claim 24, wherein the silicone is silver-plated copper filled silicone.

* * * * *